(12) United States Patent
van Stralen et al.

(10) Patent No.: US 10,767,264 B2
(45) Date of Patent: Sep. 8, 2020

(54) METHOD AND AN APPARATUS FOR PERFORMING A PLASMA CHEMICAL VAPOUR DEPOSITION PROCESS AND A METHOD

(71) Applicant: Draka Comteq B.V., Delft (NL)

(72) Inventors: Mattheus Jacobus Nicolaas van Stralen, Delft (NL); Igor Milicevic, Delft (NL); Gertjan Krabshuis, Delft (NL); Ton Breuls, Delft (NL)

(73) Assignee: DRAKA COMTEQ B.V., Delft (NL)

( * ) Notice: Subject to any disclaimer, the term of this patent is extended or adjusted under 35 U.S.C. 154(b) by 0 days.

(21) Appl. No.: 15/723,712

(22) Filed: Oct. 3, 2017

(65) Prior Publication Data

US 2018/0023196 A1    Jan. 25, 2018

(30) Foreign Application Priority Data

Apr. 10, 2016    (NL) ..................................... 2017575

(51) Int. Cl.
*C23C 16/511*    (2006.01)
*C03B 37/018*    (2006.01)

(52) U.S. Cl.
CPC ........ *C23C 16/511* (2013.01); *C03B 37/0183* (2013.01); *Y02P 40/57* (2015.11)

(58) Field of Classification Search
CPC ..... C23C 16/511; C03B 37/0183; Y02P 40/57
See application file for complete search history.

(56) References Cited

U.S. PATENT DOCUMENTS

| 3,577,207 A | 5/1971 | Kirjushin |
| 4,125,389 A | 11/1978 | King |
| RE30,635 E | 6/1981 | Kuppers |
| 4,844,007 A | 7/1989 | Eikelboom |
| 4,877,938 A | 10/1989 | Rau |

(Continued)

FOREIGN PATENT DOCUMENTS

| CN | 1630925 A | 6/2005 |
| CN | 103160808 A | 6/2013 |

(Continued)

OTHER PUBLICATIONS

Dutch Search Report and Written Opinion dated Jul. 13, 2017 for NL 2017575.
Marcuvitz Nathan; "Waveguide Handbook;" 1951; pp. 89-96.

*Primary Examiner* — Katherine A Bareford
*Assistant Examiner* — Christina D McClure
(74) *Attorney, Agent, or Firm* — Shumaker, Loop & Kendrick, LLP

(57) ABSTRACT

A method and apparatus for performing a plasma chemical vapour deposition process including a mainly cylindrical resonator having an outer cylindrical wall and an inner coaxial cylindrical wall defining therebetween a resonant cavity operable at an operating frequency. The resonant cavity extends in a circumferential direction around a cylindrical axis of the inner and outer cylindrical wall. The outer cylindrical wall includes an input port connectable to an input waveguide. The inner cylindrical wall includes slit sections extending in a circumferential direction around the cylindrical axis. A greatest dimension defining the aperture of the slit sections is smaller than half the wavelength of the operating frequency.

9 Claims, 5 Drawing Sheets

(56) References Cited

U.S. PATENT DOCUMENTS

| | | | |
|---|---|---|---|
| 5,037,666 | A | 8/1991 | Mori |
| 5,134,965 | A | 8/1992 | Tokuda |
| 5,517,085 | A | 5/1996 | Engemann |
| 5,595,793 | A | 1/1997 | Blinov |
| 5,707,452 | A | 1/1998 | Dandl |
| 5,874,706 | A | 2/1999 | Ishii |
| 6,057,645 | A | 5/2000 | Srivastava |
| 6,198,224 | B1 | 3/2001 | Spitzl |
| 6,260,510 | B1 | 7/2001 | Breuls |
| 6,372,305 | B2 | 4/2002 | Breuls |
| 6,543,380 | B1 | 4/2003 | Sung-Spitzl |
| 6,706,141 | B1 | 3/2004 | Steinhardt |
| 6,715,441 | B2 | 4/2004 | Breuls |
| 6,951,798 | B2 | 10/2005 | Booske |
| 7,650,853 | B2 | 1/2010 | Van Stralen |
| 7,759,874 | B2 | 7/2010 | Hartsuiker |
| 7,866,188 | B2 | 1/2011 | Van Stralen |
| 7,975,646 | B2 | 7/2011 | Rius |
| 7,981,485 | B2 | 7/2011 | Van Stralen |
| 8,662,011 | B2 | 3/2014 | Van Stralen |
| 2003/0159781 | A1* | 8/2003 | Van Stralen ............ C03C 17/02 156/345.41 |
| 2004/0095074 | A1 | 5/2004 | Ishii |
| 2008/0226840 | A1 | 9/2008 | Asmussen |
| 2009/0266487 | A1 | 10/2009 | Tian |
| 2012/0186747 | A1 | 7/2012 | Obama |
| 2013/0033342 | A1 | 2/2013 | Li |
| 2013/0125817 | A1 | 5/2013 | Van Stralen |
| 2013/0152858 | A1 | 6/2013 | Milicevic |

FOREIGN PATENT DOCUMENTS

| | | |
|---|---|---|
| EP | 0 554 845 A1 | 8/1993 |
| EP | 0 564 359 B1 | 9/1996 |
| EP | 2 605 267 A2 | 6/2013 |

\* cited by examiner

METHOD AND AN APPARATUS FOR PERFORMING A PLASMA CHEMICAL VAPOUR DEPOSITION PROCESS AND A METHOD

TECHNICAL FIELD AND BACKGROUND

The invention relates to a method for performing a plasma chemical vapour deposition process, comprising the step of providing an apparatus comprising a mainly cylindrical resonator being provided with an outer cylindrical wall and an inner coaxial cylindrical wall defining therebetween a resonant cavity operable at an operating frequency and extending in a circumferential direction around a cylindrical axis of the inner and outer cylindrical wall, wherein the outer cylindrical wall includes an input port connectable to an input waveguide, and wherein the inner cylindrical wall includes slit sections extending in a circumferential direction around the cylindrical axis, the method further comprising the step of operating the apparatus at an operating frequency.

European patent publication EP 2 605 267 in the name of Draka Comteq B.V. discloses an apparatus for manufacturing an optical fiber. In the plasma activated chemical vapour deposition (PCVD) process, deposition is performed on the inside of a substrate tube. In this process, the resonator is fed by a microwave source (typically a magnetron). Inside the substrate tube, the microwave power creates a plasma which activates a reaction resulting in deposition of thin quartz layers within the substrate tube. The substrate tube and resonator are placed inside a furnace.

When upscaling the PCVD process to applications for manufacturing larger substrate tubes, especially tubes having a larger diameter, e.g. for the purpose of increasing productivity, there is a need for a high degree of rotational symmetry in the quartz deposition, for a reduced chance of mode hopping causing plasma instabilities and inducing plasma flickering phenomena, and for minimal axial near-periodical variation in thickness and refractive index due to microwave oscillations caused by interaction with the surrounding such as the PCVD furnace. The axial near-periodical variation may have strong impact on some resulting fiber quality parameters such as the attenuation (OTDR traces) and/or the uniformity of mode-field diameter for single mode fiber and/or the uniformity of the alpha-value for graded index multi-mode fiber.

BRIEF SUMMARY

It is an object of the invention to provide a method according to the preamble for processing substrate tubes having a relatively larger diameter. Thereto, according to the invention, the apparatus is operated at an operating frequency such that a greatest dimension defining the aperture of the slit sections is smaller than half the wavelength of the operating frequency. Generally, the greatest dimension defining the aperture of the slit sections is the largest of its length or width.

By applying slit sections wherein the greatest dimension, such as a circumferential length of the slit section, is smaller than half the wavelength of the operating frequency, no propagating modes may propagate through the slit section. Only non-propagating modes may radiate through the slit section.

The invention is at least partly based on the insight that non-propagating electromagnetic modes can effectively be used for transporting electromagnetic energy in a stable manner for powering the plasma, while suppressing radial propagating electromagnetic modes. Since the power of non-propagating modes decays exponentially in a radiating direction, a specific non-propagating electromagnetic mode becomes dominant, usually a highest order non-propagating mode, thereby reducing chances of mode hopping. Any influence of higher-order mode is minimal. Also electromagnetic radiation that is reflected back into the cavity, through the slit sections, is only possible by the non-propagating electromagnetic modes. Then, the exponential decaying behaviour reduces any interaction with the cavity, thereby contributing to an even improved stability of the resonator. Also, any electromagnetic mode that is initiated in the inner tubular space is of the non-propagating mode type, caused by the spatial variations in the electromagnetic spots in the inner tubular space. As a consequence, any reflection at axial ends of the substrate tube has only a minor interaction with the cavity of the resonator, leading to a yet further stabilized electromagnetic behaviour in the cavity, and also in the plasma itself, resulting in a reduced axial near-periodical variation in thickness and refractive index.

Further, especially when increased diameter substrate tubes are used, by employing non-propagating modes and suppressing propagating modes, a more uniform plasma distribution in the circumferential direction is obtained, thus improving the degree of rotational symmetry in the quartz deposition.

Experiments show that a stable plasma can be obtained in a substrate tube having an outer diameter of more than a third of the operating wavelength.

It is noted that, throughout the description, the wavelength of the operation frequency, or operating wavelength, is understood to be the wavelength in the radial waveguide formed by the slit sections extending between the cavity and the inner side of the resonator, i.e. the tubular inner space. If the slit sections are open, the wavelength is essentially the same as the wavelength in free space. However, if the slit sections are filled with a specific material such as glass, the wavelength reduces with a factor that is equal to the refractive index of said specific material.

Generally, each slit section allows microwave energy to pass radially inwardly to generate a plasma inside the substrate tube. Preferably, the intensities of the corresponding passing microwave energy substantially match, so that a balanced plasma configuration is obtained during operation of the apparatus.

The invention is also directed to an apparatus.

Further advantageous embodiments according to the invention are described in the following claims.

BRIEF DESCRIPTION OF THE DRAWINGS

By way of example only, embodiments of the present invention will now be described with reference to the accompanying figures in which.

DETAILED DESCRIPTION

The figures merely illustrate preferred embodiments according to the invention. In the figures, the same reference numbers refer to equal or corresponding parts.

Figure 1:
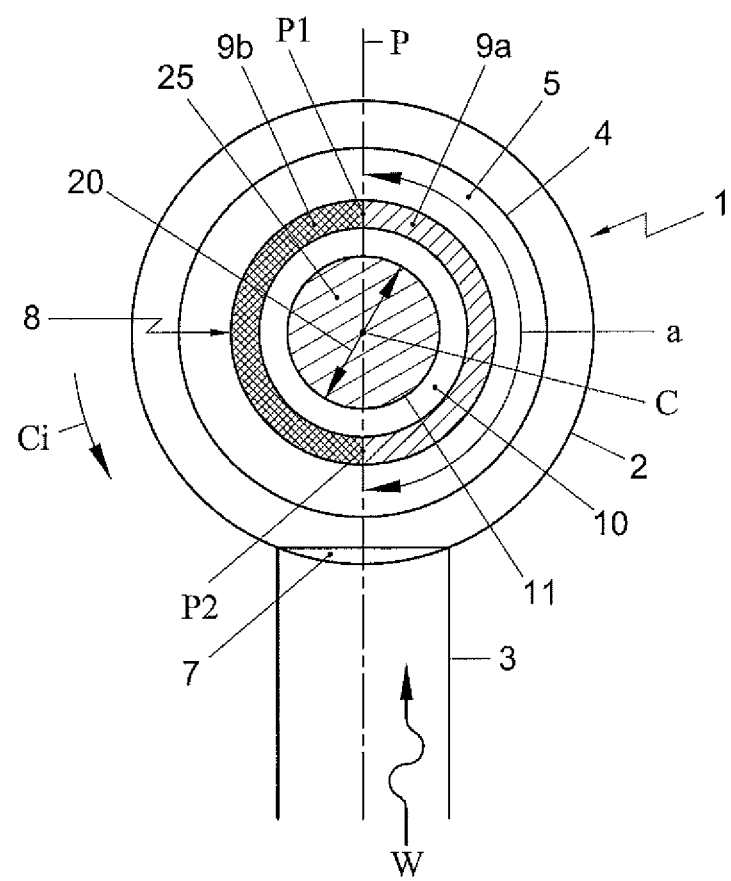
FIG. 1 shows a schematic cross sectional side view of a first embodiment of an apparatus according to the invention.

FIG. 1 shows a schematic cross sectional side view of an apparatus for performing a plasma chemical vapour deposition process. The apparatus 1 comprises a mainly cylindrical resonator 2. The apparatus also comprises an input waveguide 3 for guiding microwaves W from a microwave generator, e.g. a magnetron or a klystron, towards the resonator 2. The apparatus is operationally used for performing a plasma chemical vapour deposition process.

Figure 3:
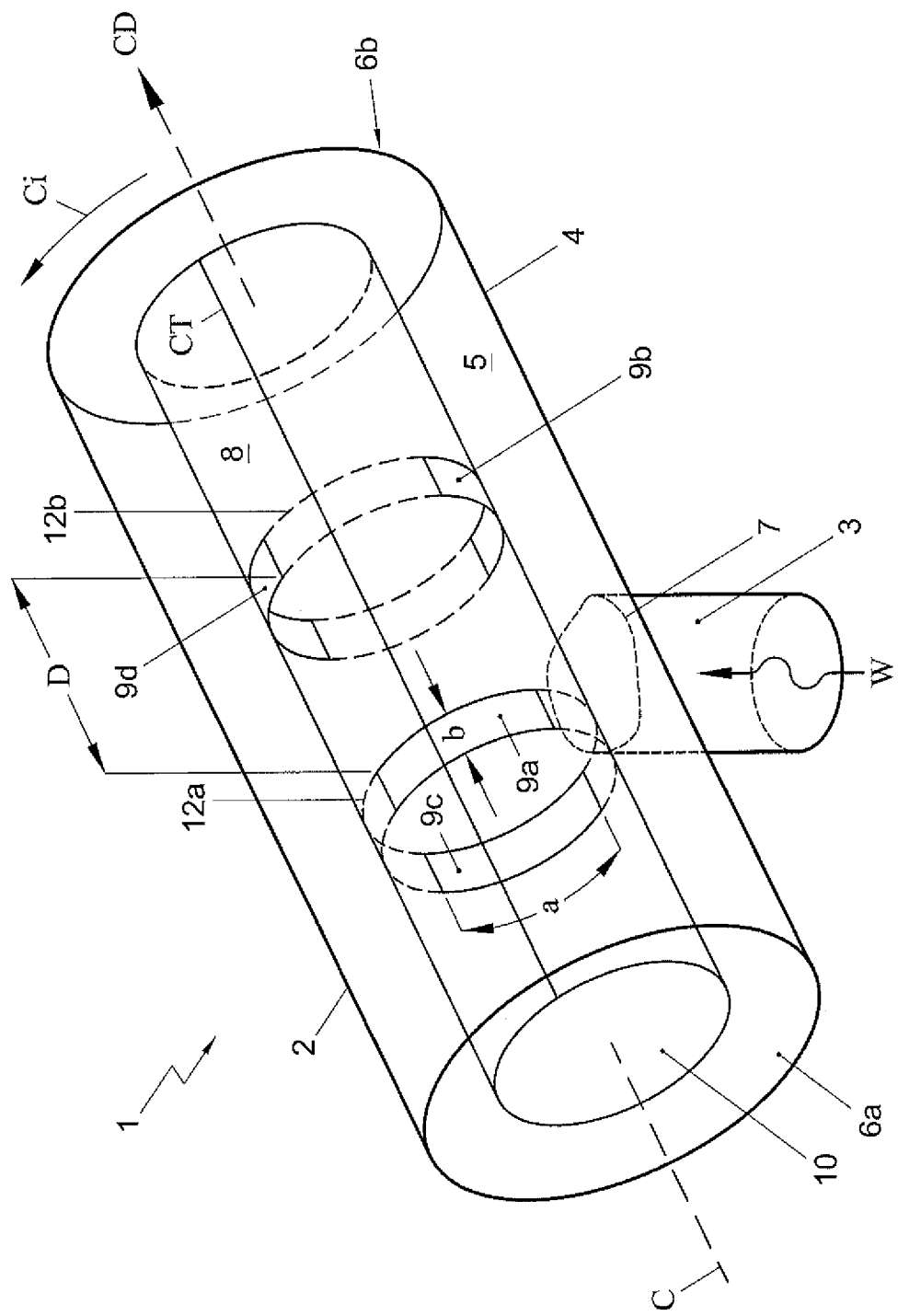
FIG. 3 shows a schematic perspective view of a second embodiment of an apparatus according to the invention.

The resonator 2 is provided with a resonant cavity 5 operable at an operating frequency f bounded by an outer cylindrical wall 4 and an inner cylindrical wall 8. The cavity 5 extends in a circumferential direction Ci around a cylindrical axis C of the inner and outer cylindrical wall 8, 4. Generally, the cavity 5 has a rotational symmetric shape with respect to a cylindrical axis C. The resonator 2 is further provided with side wall portions 6a,b bounding the resonant cavity 5 in a cylindrical direction CD as shown in FIG. 3.

The inner cylindrical wall 8 bounds the resonance cavity 5 in a radial direction inwardly towards the cylindrical axis C, while the outer cylindrical wall 4 bounds the resonance cavity 5 in a radial direction outwardly. In fact, the cavity 5 is thus annular shaped.

The outer cylindrical wall includes an input port 7 connected to the input waveguide 3.

The inner cylindrical wall 8 includes slit sections 9a,b extending in a circumferential direction Ci around the cylindrical axis C. By providing the slit sections 9a,b, microwave energy may enter from the resonance cavity 5, into a tubular inner space 10 surrounded by the resonator 2.

The apparatus 1 is placed in a furnace (not shown) to condition operation temperature during application of the plasma chemical vapour deposition process.

During operation of the apparatus, microwaves generated by the microwave generator, such as a magnetron or klystron (not shown), are injected into the input waveguide 3, also called waveguide, and then propagate through the waveguide towards the resonator 2. The microwave generator is arranged for generating microwaves at an operating frequency f. It is noted that the microwaves may enter the waveguide 3 also in another manner, e.g. via an assembly of additional waveguides. In the resonance cavity 5 microwave energy accumulates. The microwave energy partly enters, via the slit sections 9a,b, the tubular inner space 10 and generates a plasma in the interior 25 of a substrate tube 11 arranged in said tubular inner space 10, for carrying out a plasma chemical vapour deposition (PCVD) process. The substrate tube 11 has an outside diameter 20 that can be more than a third of the operating wavelength. By conditioning proper gas flows (e.g. $SiCl_4$, $O_2$, $GeCl_4$, $N_2$, and/or Boron or Fluorine containing gases) and optionally reciprocating the resonator 2 over the length of the substrate tube 11, glass material is deposited on the substrate tube 11 that has been inserted in the tubular inner space 10, thereby providing a tube with multiple glass layers deposited on the inside. Such a tube can be collapsed to form a solid preform or core rod, which can be further processed for manufacturing a glass fiber.

The slit sections 9a,b form a pair of slit sections 9a,b that extend in the circumferential direction Ci, in a consecutive order, but are mutually offset in the cylindrical direction CD. Alternatively, the slit sections are not mutually offset.

Each of the slit sections 9a,b in FIG. 1 extends in the circumferential direction Ci in a range of a semi-circle. As shown in FIG. 1, in the case of mutual offset slit sections, the circumferential end position P1 of a first slit section 9a substantially coincides with the circumferential start position of a second slit section 9b, while the circumferential end position P2 of the second slit section 9b substantially coincides with the circumferential start position of the first slit section 9a.

Generally, the slit sections 9a,b do not overlap in the circumferential direction Ci, but in the case of mutual offset slit sections, some overlap, e.g. less than circa 10% of the circumferential length a, may be provided. The pair of slit sections 9a,b face each other at opposite sides of around the tubular inner space 10, when seen in the cylindrical direction CD. The staggered slit sections 9a,b form a slit configuration that extends in the circumferential direction as a full circle. The cavity 5 includes two cavity parts adjacent the corresponding slit sections 9a,b, and partly extending in the circumferential direction Ci around the cylindrical axis C.

An offset D between the slit sections 9a,b, see e.g. FIG. 3, may be selected to be circa a quarter of the operating plasma wavelength A, so that the effect of the electromagnetic interaction with the furnace walls is minimized. Generally, the offset D between slit sections 9a,b may be larger than e.g. circa 5 mm, preferably in a range from circa 30 mm to circa 50 mm.

The shown slit sections 9a,b have a regular geometry including a cylindrical section with a circumferential length dimension a in the circumferential direction Ci and a width dimension b in the cylindrical direction CD, see e.g. FIG. 3. The width b of the slit sections 9a,b can be constant along the circumferential direction Ci. Similarly, the circumferential length a can be constant along the cylindrical direction CD. In the shown embodiment, the circumferential length a and the width b define the aperture of the slit sections 9a,b. Generally, the width b is smaller than the circumferential length a. In principle, the slit sections may be rectangular along the inner cylindrical wall 8, as shown, or may have another geometry such as a curved polygon, an ellipse or a circle.

The slit sections 9a,b in themselves can be considered as a short radial waveguide extending between the cavity 5 and the inner side of the resonator 2, i.e. the tubular inner space 10. The dimensions of the radial waveguide are determined by the circumferential length a and the width b of the slit sections, and by the thickness or depth of the inner cylindrical wall 8.

The circumferential dimension a of the slit sections is smaller than half the wavelength $\lambda$ of the operating frequency f, i.e. the frequency of the of the microwaves that propagate towards the resonator 2 and into the tubular inner space 10. The operating frequency can e.g. be in a range between circa 900 MHz and circa 928 MHz, or in a range between circa 2.4 GHz and circa 2.5 GHz, or in a range between circa 5.725 GHz and circa 5.875 GHz. As an example, an operating frequency of circa 2.46 GHz can be selected.

By arranging the apparatus 1 such that the circumferential length dimension a of the slit section 9a,b is smaller than half the wavelength $\lambda$ of the operating frequency f, all modes in the radial waveguide are non-propagating. Generally, according to an aspect of the invention, the radial waveguide formed by a slit section only allows non-propagating modes if a greatest dimension defining the aperture of the slit section is smaller than half the wavelength $\lambda$ of the operating frequency f. Then, the maximum extension of a slit section in any direction is less than half the wavelength $\lambda$ of the operating frequency f. As an example, the circumferential length a of the slit section 9a,b is one third of the wavelength $\lambda$ of the operating frequency f. However, the circumferential length a can be larger, e.g. slightly smaller than half the wavelength $\lambda$ of the operating frequency f, or can be smaller, e.g. one quarter of the wavelength λ of the operating frequency f. Preferably, at least one slit section has a cross sectional area that is different from a cross sectional area of other slit sections, e.g. for tuning the transmitted power.

By selecting a specific cross sectional area, e.g. a specific width b of the slit sections, an amount of energy transmitted through said slit sections can be set. Generally, a larger cross sectional area enables more power to be transmitted into the tubular inner space 10. Preferably, the intensities of the corresponding microwave energies passing through the respective slit sections substantially match, so that a balanced plasma configuration is obtained during operation of the apparatus. Then, slit sections adjacent to the input waveguide 3 may have a relatively small cross sectional area, while slit sections that are more remote from the input waveguide 3 may have a relatively large cross sectional area. In the case of slit sections having a rectangular geometry along the inner cylindrical wall the cross section may be conveniently changed by changing the width b while keeping the circumferential length a constant. Alternatively, the slit sections have the same dimensions.

Figure 2:
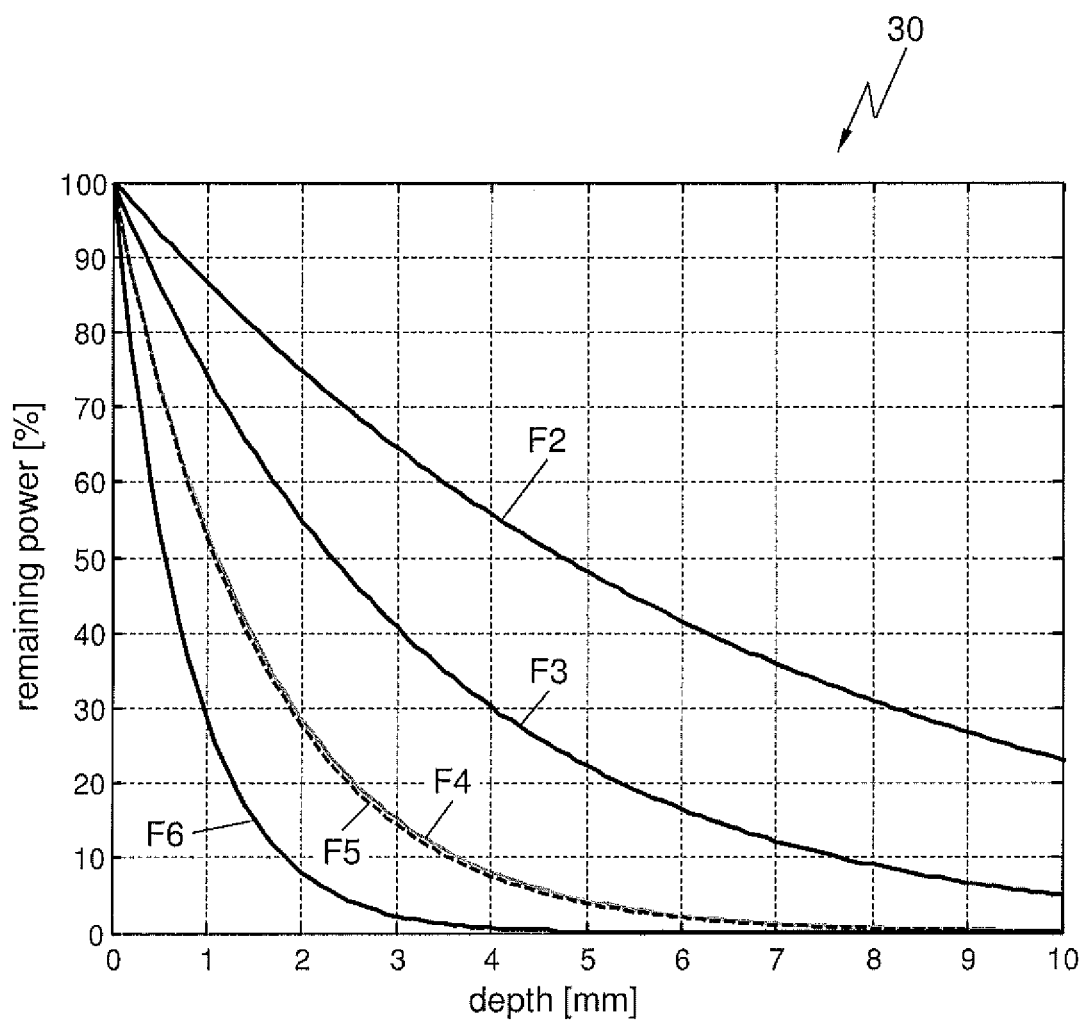
FIG. 2 shows a diagram of power that remains of electromagnetic modes radiating through a slit section.

FIG. 2 shows a diagram 30 of power that remains of electromagnetic modes radiating through a slit section 9 as a function of a depth of said slit section 9, equal to the thickness of the inner cylindrical wall 8. The diagram 30 shows a first, second, third, fourth and fifth curve F2-F6 corresponding to an electromagnetic mode E(1,0), E(2,0), E(0,1), E(1,1) and E(0,2), respectively, radiating through a slit section extending along a quarter of circle, as shown in FIG. 3 described below.

All curves F2-F6 have an exponential decaying behaviour as a function of the thickness of the inner cylindrical wall 8. The corresponding electromagnetic modes are of a so-called non-propagating type meaning that there is no propagating wave because the aperture of the slit section is too small compared with the wavelength of the operating frequency, in other words: the operating frequency is below the cut-off frequency of the lowest order mode, or yet in other words: the wavelength of the operating frequency is higher than the cut-off wavelength of the lowest order mode. Then, all modes are non-propagating.

In this respect it is noted that no fundamental mode, i.e. a (0,0) mode,—having no cut-off frequency—is injected into the tubular inner space 10 as there is no slit extending in a full circle of the inner cylindrical wall 8.

Due to the exponential decaying behaviour, only one non-propagating mode has a major contribution in radiation energy into the tubular inner space 10.

Generally, each slit section, also called physical port, can be considered as a waveguide potentially containing several waveguide modes. For a correct microwave description, each mode can be represented as a separate port. However, those ports corresponding to modes which are hardly excited and/or have a large power decay, can be neglected in practice.

The propagation properties inside the slit section depend on its transverse shape and dimensions. Let b be the maximum extension of the slit section in the cylindrical direction CD, let a be the maximum extension in the transverse direction in the plane of the aperture, e.g. the circumferential direction Ci, (φ for circular shape) and let L be the length of waveguide (equals the depth/height of the slit). Then the cut-off wavelength for E-type or H-type mode (m,n) equals (or is smaller than in case of non-rectangular transverse opening)

$$\lambda'_{ci} = \frac{2\sqrt{ab}}{\sqrt{m^2 \frac{b}{a} + n^2 \frac{a}{b}}}.$$

If the wavelength of the electromagnetic wave inside the material located in the slit (typically air, but it could be also quartz or mixed) is larger than the cut-off wavelength of the (m,n) mode, then the (m,n) mode is a non-propagating mode. Otherwise it is a propagating mode. At 2.45 GHz, the wavelength in air is about 122 mm.

Note that a (0,0) mode (i.e. m=0 & n=0) only exists if the opening is fully around the tube. Note also that a (0,0) mode is always a propagating mode. The next mode(s) is/are propagating when the width b of the slit or the inner circumference of the resonator is at least equal to the wavelength. In the latter case, this corresponds, when operating at 2.45 GHz, to a diameter of the inner cylindrical wall 8 of circa 39 mm.

The transverse functional behaviour of the lowest order modes in a slit section fully around the tube is of the form $$E(m,0): E_z, H_\varphi \sim \cos m\varphi; E_r \sim \sin m\varphi$$

$$E(0,n): E_z, H_\varphi \sim \cos n\pi z/b; E_r \sim \sin n\pi z/b$$

$$H(0,n): H_z, E_\varphi \sim \sin n\pi z/b; H_r \sim \cos n\pi z/b$$

Note that for the E(m,0) modes the symmetry plane at cos mφ=0 is a magnetic wall, while the symmetry plane at sin mφ=0 (m≠0) is an electric wall. Note that the E(0,n) modes have magnetic walls as symmetry planes, and the H(0,n) modes have electric walls as symmetry planes.

When a full slit is split into two equal parts, the m=0 is obsolete. Two decoupled E(m,0) modes correspond to one E(m,0) mode of the full slit. When a full slit is split into four equal parts, four decoupled E(m,0) modes correspond to one E(2m,0) mode of the full slit.

The decay of a propagating mode inside a slit section is negligible because it is only due to the absorption on the short metal walls. The decay of a non-propagating mode inside a slit depends on the length L and the order (m,n) of the mode. In case of a slit section extending in a locally flat plane, the decay of the amplitude equals $$e^{-\gamma L}$$

where $$\gamma = \frac{2\pi}{\lambda_c} \sqrt{1 - \left(\frac{\lambda_c}{\lambda}\right)^2}, \quad \lambda > \lambda_c.$$

In case of a slit in a locally curved, such as a circular or elliptic curved metallic surrounding, the decay might be even stronger.

In FIG. 2 the power decay inside a slit section of an exemplary apparatus having a four slit section configuration described below referring to FIG. 3 is shown.

FIG. 3 shows a schematic perspective view of a second embodiment of an apparatus 1 according to the invention. Here, the inner cylindrical wall 8 includes four slit sections 9a-d extending in the circumferential direction Ci around the cylindrical axis C. Again, a greatest dimension defining the aperture of the slit sections 9a-d is smaller than half the wavelength λ of the operating frequency f, so that only non-propagating modes may pass through the slit sections 9a-d.

Similar to the slit sections in FIG. 1, the slit sections 9a-d in FIG. 3 are staggered on two slit lines 12a-b circumscribing the cylindrical axis C on the inner cylindrical wall 8. The slit lines 12a-b have an offset D with respect to each other in the cylindrical direction CD. The circumferential offset of adjacent slit sections 9 is preferably 360 degrees divided by the number of slit sections, in the embodiment shown in FIG. 3, 360 degrees divided by 4 is 90 degrees. Then, the slit sections 9 are mainly evenly distributed in the circumferential direction Ci so that the slit sections 9 in combination substantially circumscribe the cylindrical axis C on the inner cylindrical wall 8.

Further, the slit sections include two pairs of slit sections 9a,c; 9b,d that are located symmetrical with respect to the cylindrical axis C, at opposite sides.

It is noted that the inner cylindrical wall 8 may include more than two or four slit sections, e.g. three, five, six, seven, eight or more slit sections, e.g. depending on the diameter of the inner cylindrical wall and intended operating wavelength. For reasons of symmetry it might be preferred that the number of slit sections is an even number.

It is further noted that the slit sections may be aligned to a single slit line, as an alternative to the staggered configuration described above.

Generally, the geometry of the slit sections 9 in the inner cylindrical wall 8 can also be described when projecting said wall 8 to a flat plane such that the circumferential direction Ci is transformed into a linear length parameter 1. Geometrically, the transformation is a representation of the inner cylindrical wall 8 when opened along a cutting CT extending in said wall 8 parallel along the cylindrical direction C, said wall 8 being folded open and straightened in a flat plane.

Figure 4:
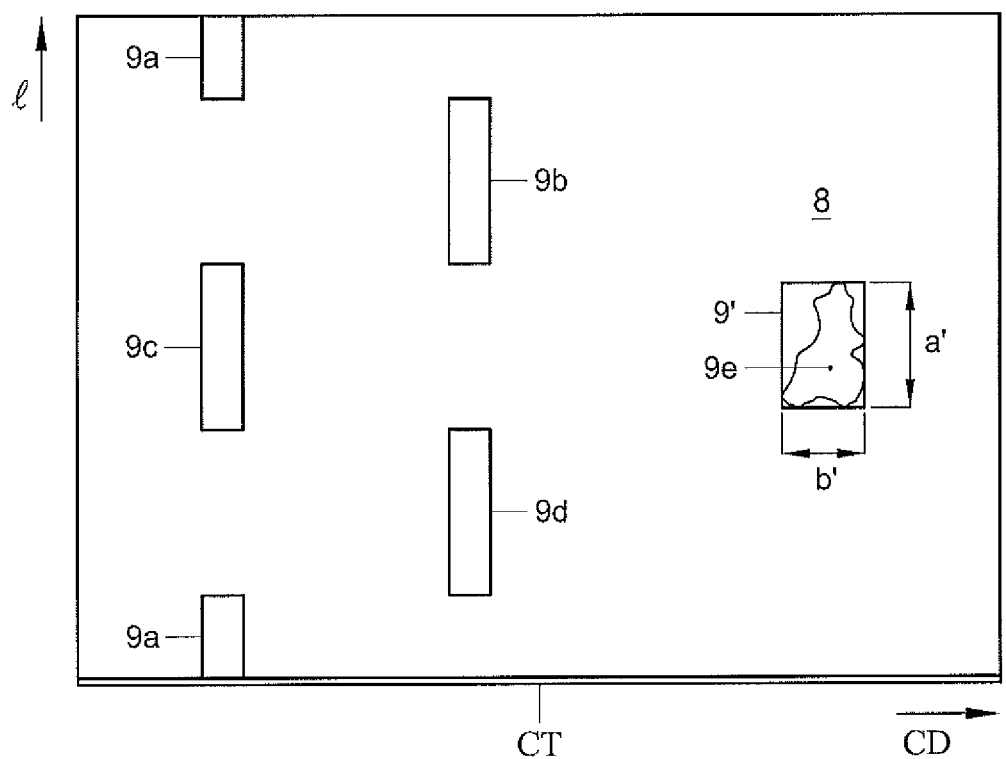
FIG. 4 shows a schematic view of a projection of the cylindrical wall in the apparatus shown in FIG. 3.

FIG. 4 shows a schematic view of a projection of the cylindrical wall 8 wherein the circumferential direction Ci is transformed into a linear length parameter 1. The slit sections 9a-d in the projected cylindrical wall have a rectangular geometry parameterized by a length a and a width b in the cylindrical direction CD. The greatest dimension of the slit sections 9a-d, in the projected plane, is a linear dimension, i.e. the length a in the length direction 1, that is smaller than half the wavelength $\lambda$ of the operating frequency f.

As indicated above, the slit sections 9 may have another shape, e.g. a square, a polygon, a circle, an ellipse or another curved shape. In FIG. 4 an additional slit section 9e is shown having a specific non-rectangular shape. The additional slit section 9e is surrounded by a rectangular contour 9' parameterized by a smallest value for its length a' and width b' while still enclosing the additional slit section 9e. The greatest of the length a' and width b', in the shown case the linear dimension of its length a', is considered as the greatest dimension of the additional slit section 9e that is smaller than half the wavelength $\lambda$ of the operating frequency f. Then, all modes in the radial waveguide defined by the additional slit section 9e are non-propagating.

Figure 5:
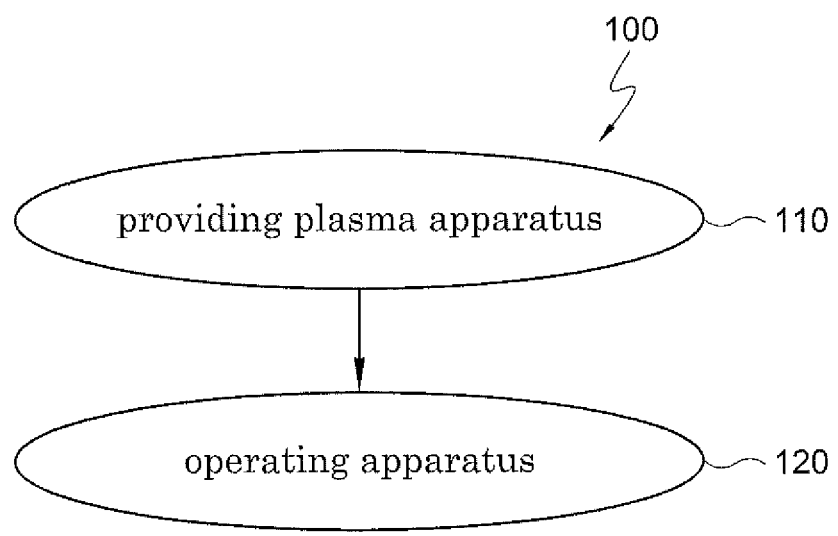
FIG. 5 shows a flow chart of a method according to the invention.

FIG. 5 shows a flow chart of a method according to the invention. The method 100 is used for performing a plasma chemical vapour deposition process. The method comprises a step of providing 110 an apparatus comprising a mainly cylindrical resonator being provided with an outer cylindrical wall and an inner coaxial cylindrical wall defining therebetween a resonant cavity operable at an operating frequency and extending in a circumferential direction around a cylindrical axis of the inner and outer cylindrical wall, wherein the outer cylindrical wall includes an input port connectable to an input waveguide, and wherein the inner cylindrical wall includes slit sections extending in a circumferential direction around the cylindrical axis. Further, the method comprises a step of operating 120 the apparatus at an operating frequency such that a circumferential dimension of the slit sections is smaller than half the wavelength of the operating frequency.

The invention is not restricted to the embodiments described herein. It will be understood that many variants are possible.

As an example, the length of the resonant cavity in the cylindrical direction CD may be constant as a function of the radial distance to the cylindrical axis C, but may in another embodiment vary as a function of the radial distance to the cylindrical axis. In the former case, the cavity can be mainly uniform in the cylindrical direction CD. In the latter case, the cavity may have a more complex boundary at the radial inner side, e.g. for matching and/or minimal arcing purposes, e.g. including partially a surface of a cone that is coaxial with the cylindrical axis C as described in European patent publication EP 2 594 660.

It is noted that the inner and outer cylinder wall may have a cross sectional contour that is a circle or another closed contour such as an ellipse or a polygon.

These and other embodiments will be apparent for the person skilled in the art and are considered to fall within the scope of the invention as defined in the following claims. For the purpose of clarity and a concise description features are described herein as part of the same or separate embodiments. However, it will be appreciated that the scope of the invention may include embodiments having combinations of all or some of the features described.

What is claimed is:

1. A method for performing a plasma chemical vapour deposition process, comprising the steps of:
   providing an apparatus comprising a mainly cylindrical resonator being provided with an outer cylindrical wall and an inner coaxial cylindrical wall defining therebetween a resonant cavity operable at an operating frequency and extending in a circumferential direction around a cylindrical axis of the inner and outer cylindrical wall, wherein the outer cylindrical wall includes an input port connectable to an input waveguide, wherein the inner cylindrical wall includes slit sections extending in a circumferential direction around the cylindrical axis; and operating the apparatus for performing a plasma chemical vapour deposition process at an operating frequency such that a greatest dimension defining the aperture of the slit sections is smaller than half the wavelength of the operating frequency, propagating modes are not allowed to radiate through the aperture of the slit sections, and non-propagating modes are allowed to radiate through the aperture of the slit sections.

2. The method according to claim 1, wherein the apparatus coaxially surrounds a substrate tube having an outer diameter of more than a third of the wavelength of the operating frequency.

3. A method according to claim 1, wherein a circumferential dimension of the slit sections is smaller than half the wavelength of the operating frequency.

4. A method according to claim 1, wherein the slit sections are staggered on two slit lines circumscribing the cylindrical axis.

5. A method according to claim 1 wherein the slit sections are offset relative to each other, in the cylindrical direction.

6. A method according to claim 1 wherein a width dimension of the slit sections in the cylindrical direction is smaller than the circumferential dimension of the slit sections.

7. A method according to claim 1 wherein the greatest dimension defining the aperture of the slit sections is a linear dimension.

8. A method according to claim 1 further including a step of generating microwaves at the operating frequency, using a microwave generator.

9. A method according to claim 1 further including a step of guiding microwaves from the generator towards the resonator, using the input waveguide.

* * * * *